(12) United States Patent
Takahashi et al.

(10) Patent No.: US 8,436,250 B2
(45) Date of Patent: May 7, 2013

(54) METAL CORE CIRCUIT ELEMENT MOUNTING BOARD

(75) Inventors: Kouji Takahashi, Isesaki (JP); Yusuke Igarashi, Isesaki (JP); Jun Sakano, Kiryuu (JP)

(73) Assignees: SANYO Electric Co., Ltd., Moriguchi-shi (JP); SANYO Semiconductor Co., Ltd., Ora-gun (JP)

( * ) Notice: Subject to any disclaimer, the term of this patent is extended or adjusted under 35 U.S.C. 154(b) by 316 days.

(21) Appl. No.: 12/516,769

(22) PCT Filed: Nov. 29, 2007

(86) PCT No.: PCT/JP2007/073538
§ 371 (c)(1),
(2), (4) Date: May 28, 2009

(87) PCT Pub. No.: WO2008/069260
PCT Pub. Date: Jun. 12, 2008

(65) Prior Publication Data
US 2010/0012360 A1    Jan. 21, 2010

(30) Foreign Application Priority Data
Nov. 30, 2006    (JP) .................. 2006-324535

(51) Int. Cl.
*H05K 1/03*    (2006.01)
(52) U.S. Cl.
USPC ..................................... 174/255
(58) Field of Classification Search .......... 174/255
See application file for complete search history.

(56) References Cited

U.S. PATENT DOCUMENTS

| | | | | |
|---|---|---|---|---|
| 5,231,751 | A | * | 8/1993 | Sachdev et al. ............. 29/852 |
| 5,323,036 | A | * | 6/1994 | Neilson et al. ............. 257/287 |
| 5,539,246 | A | * | 7/1996 | Kapoor .................... 257/618 |
| 5,847,327 | A | * | 12/1998 | Fischer et al. ............. 174/258 |
| 6,098,282 | A | * | 8/2000 | Frankeny et al. ............ 29/852 |
| 6,222,740 | B1 | * | 4/2001 | Bovensiepen et al. ....... 361/795 |

(Continued)

FOREIGN PATENT DOCUMENTS

| | | |
|---|---|---|
| JP | 63-72180 | 4/1988 |
| JP | 5-218606 | 8/1993 |

(Continued)

OTHER PUBLICATIONS

International Search Report mailed on Mar. 11, 2008 directed at counterpart application No. PCT/JP2007/073538;2 pages.

*Primary Examiner* — Timothy Thompson
*Assistant Examiner* — Nathan Milakovich
(74) *Attorney, Agent, or Firm* — Morrison & Foerster LLP

(57) ABSTRACT

A circuit device of the present invention includes a wiring board 45, and circuit elements such as semiconductor elements 32 mounted on the wiring board 45. The wiring board 45 includes: a conductive pattern 12, which is a metal core layer; a first insulating layer 14 and a second insulating layer 16 respectively covering an upper surface and a lower surface of the conductive pattern 12; and a first wiring layer 18 and a second wiring layer 20 formed respectively on an upper surface of the first insulating layer 14 and a lower surface of the second insulating layer 16. The conductive pattern 12 is made of rolled metal. With this configuration, the thermal resistance of the conductive pattern 12, which is the metal core, is reduced, and the thermal dissipation of the entire device can be improved.

4 Claims, 11 Drawing Sheets

U.S. PATENT DOCUMENTS

| | | | |
|---|---|---|---|
| 6,274,404 B1 * | 8/2001 | Hirasawa et al. | 438/107 |
| 6,548,328 B1 * | 4/2003 | Sakamoto et al. | 438/121 |
| 6,706,547 B2 * | 3/2004 | Sakamoto et al. | 438/33 |
| 6,744,135 B2 * | 6/2004 | Hasebe et al. | 257/712 |
| 7,095,623 B2 * | 8/2006 | Suwa et al. | 361/795 |
| 7,329,957 B2 * | 2/2008 | Sakano et al. | 257/778 |
| 7,420,266 B2 * | 9/2008 | Takahashi | 257/669 |
| 7,537,965 B2 * | 5/2009 | Oman | 438/123 |
| 2003/0168249 A1 * | 9/2003 | Ito et al. | 174/255 |
| 2005/0146052 A1 * | 7/2005 | Sakamoto et al. | 257/780 |
| 2006/0000636 A1 * | 1/2006 | Lauffer et al. | 174/255 |
| 2006/0185141 A1 * | 8/2006 | Mori et al. | 29/25.41 |
| 2012/0267149 A1 * | 10/2012 | Oi | 174/255 |

FOREIGN PATENT DOCUMENTS

| | | |
|---|---|---|
| JP | 8-288606 | 11/1996 |
| JP | 9-289225 | 11/1997 |
| JP | 2001-15868 | 1/2001 |
| JP | 2002-76182 | 3/2002 |
| JP | 2002-332544 | 11/2002 |
| JP | 2003-101177 | 4/2003 |
| JP | 2003-324263 | 11/2003 |
| JP | 2004-31732 | 1/2004 |
| JP | 2004-207277 | 7/2004 |
| JP | 2005-311249 | 11/2005 |

* cited by examiner

Prior Art

US 8,436,250 B2

METAL CORE CIRCUIT ELEMENT MOUNTING BOARD

REFERENCE TO RELATED APPLICATIONS

This application is a national stage application under 35 USC 371 of International Application No. PCT/JP2007/073538, filed Nov. 29, 2007, which claims priority from Japanese Patent Application No. 2006-324535, filed Nov. 30, 2006, the contents of which are incorporated herein by reference.

FIELD OF THE INVENTION

The present invention relates to a circuit element mounting board, and a circuit device and the like using the same, and particularly to those including a wiring board having an insulating layer and an wiring layer formed on each of both sides of a metal core layer to be in the middle.

BACKGROUND OF THE INVENTION

Along with a reduction in size and an increase in functionality of electronic equipment such as mobile phones, circuit devices including multiple wiring layers have become dominant among those housed inside the electronic equipment. This technique is described in Japanese Patent Application Publication No. 2003-324263, for example. Referring to FIG. 8, a circuit device including a multi-layered substrate 107 will be described.

Here, the circuit device is configured by mounting a circuit element such as a package 105 on a first wiring layer 102A formed on an upper surface of the multi-layered substrate 107.

In the multi-layered substrate 107, wiring layers are formed on an upper surface and a back surface of a base 101 made of glass epoxy resin. Here, a first wiring layer 102A and a second wiring layer 102B are formed on the upper surface of the base 101. The first wiring layer 102A and the second wiring layer 102B are stacked with an insulating layer 103 interposed therebetween. On the lower surface of the base 101, a third wiring layer 102C and a fourth wiring layer 102D are stacked with another insulating layer 103 interposed therebetween. The wiring layers are connected to each other at predetermined positions by connection parts 104 formed by penetrating the insulating layer 103.

To the first wiring layer 102A, which is the uppermost layer, a package 105 is fixed. Here, the package 105 having a semiconductor element 105A therein and sealed with resin is surface mounted on the first wiring layer 102A through connection electrodes 106.

However, since the base 101 included in the multi-layered substrate 107 having the above-described structure is made of resin, heat generated from the package 105 is difficult to release to the outside.

Moreover, to improve the mechanical strength and also the heat dissipation of the multi-layered substrate 101, the base 101 is highly filled with filler such as alumina. However, resin mixed with a large amount of filler tends to be brittle, and thus cracks frequently occur in the base 101 in a transport process and the like.

Further, when a conductive foil made of a plated metal core material is used for the base 101, a problem consequently arises that the mechanical strength of the entire base 101 becomes poor because such a conductive foil has poor mechanical strength.

SUMMARY OF THE INVENTION

The present invention has been made in view of the above-described problems, and a main object of the present invention is to provide a substrate and the like including wiring layers excellent in heat dissipation and mechanical strength.

The present invention includes a metal core layer, and multiple wiring layers stacked on the metal core layer to be in the middle, through insulating layers respectively covering an upper surface and a lower surface of the metal core layer, and the metal core layer is made of rolled metal.

According to the present invention, the rolled metal is a material excellent in heat dissipation and mechanical strength compared with a plated film. By using such a material as a metal core, determining the mechanical strength of the entire wiring board, heat generated from a circuit element mounted on an upper surface of the wiring board is successfully released to the outside through the wiring board with the metal core as the main material.

In addition, a conductive pattern including multiple portions is formed with the metal core by sectioning the metal core from the upper surface and the lower surface. At this time, if isolation grooves from the upper surface are shallow as shown in FIG. 10, then the planar size of the metal core under the chip results in being large at the top while being small at the bottom. Thus, the metal core can be formed to correspond with the size of the chip to be mounted, and transient heat can thereby be stored in the metal core.

DETAILED DESCRIPTION OF THE INVENTION

First Embodiment

Figure 2A:
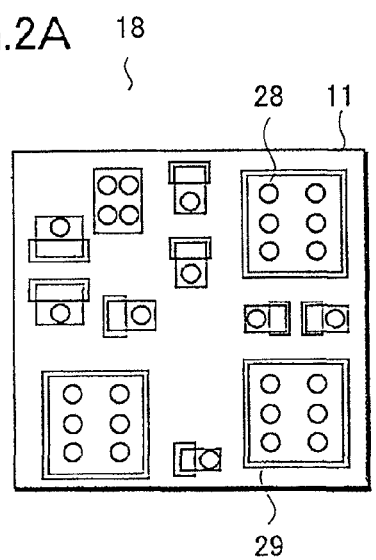
FIG. 2 includes views showing the circuit device of the present invention, (A) to (D) being plan views respectively showing different layers included in a wiring board.
Figure 2B:
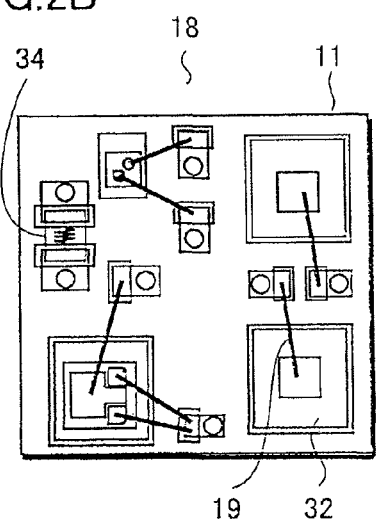
Figure 2C:
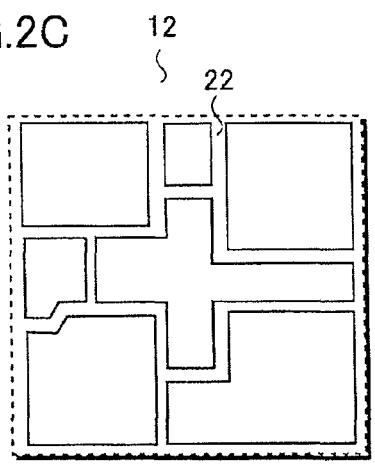
Figure 2D:
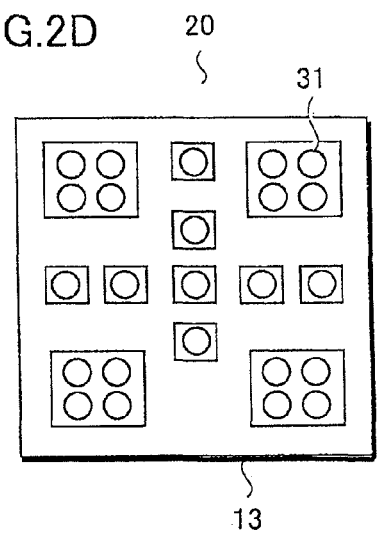
Figure 3:
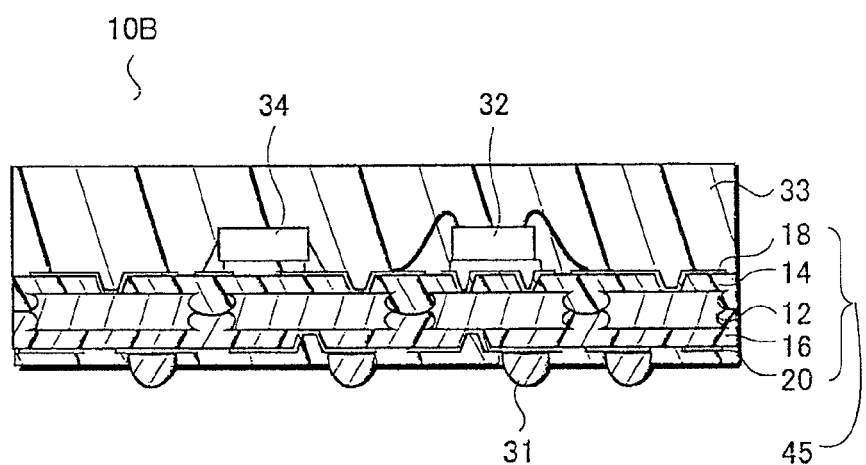
FIG. 3 is a cross-sectional view showing a circuit device of the present invention.

In this embodiment, a configuration of a circuit device of this embodiment will be described with reference to FIG. 1 to FIG. 3.

Figure 1A:
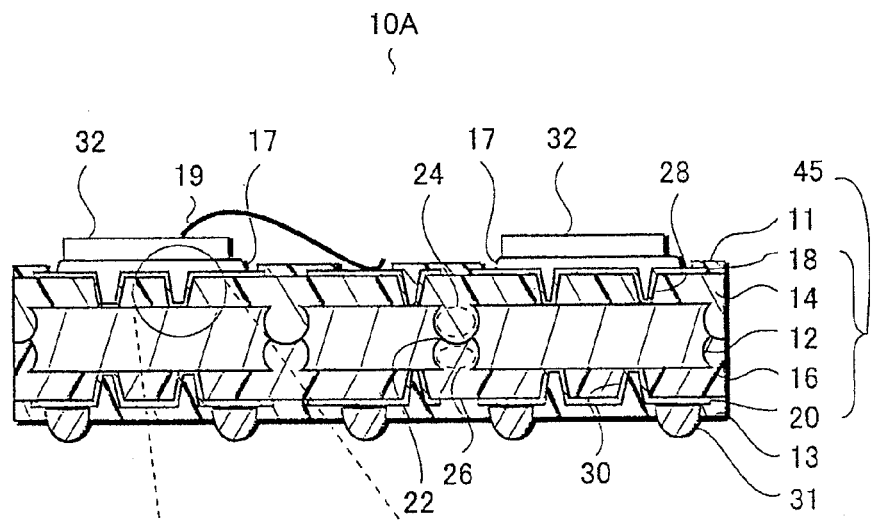
FIG. 1 includes views showing a circuit device of the present invention, (A) being a cross-sectional view, (B) being an enlarged cross-sectional view.

As shown in FIG. 1(A), a circuit device 10A is configured by mounting circuit elements such as semiconductor elements 32 on an upper surface of a wiring board 45 including a metal core layer. Further, the wiring board 45 mainly includes: a conductive pattern 12, which function as a metal core layer; a first wiring layer 18, which is stacked on an upper surface of the conductive pattern 12 through a first insulating layer 14; and a second wiring layer 20, which is stacked on a lower surface of the conductive pattern 12 through a second insulating layer 16. In this embodiment, rolled metal, which is metal being rolled, is used as a material of the conductive pattern 12, which is a metal core, thereby improving the heat dissipation and the mechanical strength of the wiring board 45 forming the circuit device 10A. It is to be noted that, although a single layer, the wiring layer 18 or the wiring layer 20, is formed on each of the upper surface and the lower surface of the core layer 12 to be in the middle in the drawing, multiple wiring layers may be formed on each of the upper surfaces and the lower surfaces.

The conductive pattern 12 functions as a metal core layer which determines the mechanical strength of the entire wiring board 45 and which improves the heat dissipation. Accordingly, the conductive pattern 12 is formed to be thicker than any of the wiring layers, and is approximately 100 μm to 200 μm in thickness, for example. As a material of the conductive pattern 12, a metal foil subjected to a rolling process is used, and, more concretely, metal, alloy or the like having copper (Cu) or aluminum (Al) as a main material can be used as the material.

Especially by using rolled metal such as a rolled copper foil as the material of the conductive pattern 12, the mechanical strength and the heat dissipation of the conductive pattern 12 can be further improved. Rolled metal has higher thermal conductivity than a plated film by approximately several percent, and has higher rigidity than a plated film. Moreover, by adding several percent by weight of impurity to the rolled metal such as a rolled copper foil used as a material of the conductive pattern 12, the rigidity can be further increased. As the impurity, any one of, or a combination of at least two of, nickel (Ni), silicon (Si), zinc (Zn), chromium (Cr), iron (Fe) and phosphorus (P) is conceivable.

The conductive pattern 12 is separated into portions at regular intervals by isolation grooves 22, each including a first isolation groove 24 and a second isolation groove 26. The isolation grooves 22 are each approximately 100 μm to 150 μm in width, for example. Here, the first isolation groove 24 is formed by selectively half-etching an upper surface of the conductive foil, which is a material of the conductive pattern 12, and the second isolation groove 26 is formed by selectively etching a back surface of the conductive foil. Then, the first isolation grooves 24 are filled with the first insulating layer 14 for covering the upper surface of the conductive pattern 12, and the second isolation grooves 26 are filled with the second insulating layer 16 for covering the lower surface of the conductive pattern 12.

Moreover, although the metal core is formed of the conductive pattern 12 isolated from each other both physically and electrically in this embodiment, the metal core may be formed of a so-called solid conductive foil not subjected to patterning. In this case as well, rolled metal is used as a metal core.

Furthermore, a side surface of each of the first isolation grooves 24 and the second isolation grooves 26 has a curved shape, thereby improving the strength of adhesion to the insulating layer filled inside the groove. Each of the portions of the conductive pattern 12 is configured to be narrow around a central portion (configured so that side walls of the portion of the conductive pattern 12 project outwardly) by isotropic wet etching. This also improves the strength of adhesion of the conductive pattern 12 to the first insulating layer 14 and the second insulating layer 16.

The first insulating layer 14 covers the upper surface of the conductive pattern 12 and the second insulting layer 16 covers the lower surface of the conductive pattern 12. The first isolation grooves 24 are filled with the first insulating layer 14, and the second isolation grooves 26 are filled with the second insulating layer 16. The thickness of each of the first insulating layer 14 and the second insulating layer 16 covering the conductive pattern 12 is approximately 50 μm to 100 μm, for example. As a material of the first insulating layer 14 and the second insulating layer 16, thermosetting resin such as epoxy resin or thermoplastic resin such as polyethylene resin can be used.

Further, by using a resin material into which fibrous or particulate filler is mixed, as a material of the first insulating layer 14 and the second insulating layer 16, the thermal resistance of each of the resin layers decreases, thereby improving the heat dissipation of the wiring board 45. Alumina, silicon oxide or silicon nitride can be used as a material of the filler. By mixing such filler into the first insulating layer 14 and the second insulating layer 16, the thermal expansion coefficient of each of the insulating layers becomes closer to that of the conductive material of the conductive pattern 12 and the like, thereby stopping the wiring board 45 from warping due to effects of temperature change.

The first wiring layer 18 is a wiring layer formed on the upper surface of the first insulating layer 14, and is formed by selectively etching a conductive film or a plated film adhered to the upper surface of the first insulating layer 14. The first wiring layer 18, patterned by etching a thin conductive film or the like, can be formed to be fine, and has a wiring width of as small as approximately 20 μm to 50 μm. The first wiring layer 18 is electrically connected to the conductive pattern 12 through interlayer connection parts 28 formed by penetrating the first insulating layer 14.

In addition, to the first insulating layer 18, circuit elements such as a chip element 34 (see FIG. 2) and the semiconductor elements 32 are electrically connected. The chip element 34 is adhered, at an electrode of each of its both ends, to the first wiring layer 18 with a conductive adhesion material such as solder. The semiconductor elements 32 such as an LSI and a transistor are mounted by the following methods, respectively. In the case of a discrete BIP or MOS TR, a current outflow or inflow electrode is included in a back surface of a semiconductor substrate, and hence such a TR is mounted on the wiring layer 18 forming a land, with a conductive adhesion material 17. The semiconductor elements 32 are each electrically connected to the metal core 12 through at least one of the connection parts 28. Although such a TR generates a large amount of current and also a large amount of heat, the metal core member has a large thickness, and can function as a heat sink, accordingly. An inverter of an air conditioner, a refrigerator, a washing machine or the like can be a circuit device including a substrate excellent in heat dissipation by connecting, in parallel, three pairs of two TRs connected in series, and connecting the GND side of the parallel connection part of the three pairs to the metal core. In the case of an LSI, the semiconductor substrate may be one of the two types, earth and floating, and is furthermore mounted in the face-down manner or the face-up manner. When the substrate is mounted in the face-down manner, the first wiring layer 18 is disposed to correspond with a pad of the LSI, and the interlayer connection parts 28 are not formed in this case. The metal core layer 12 is used simply as a heat sink. Thin metal wires or a conductive plate is used for the back surface of the semiconductor chip, and is connected to an electrode, which is a portion of the first wiring layer 18. When the substrate is mounted in the face-up manner, connection similar to that in the TR is made so that the pad electrode of the LSI and the electrode, which is a portion of the wiring layer, are connected by a thin metal wire.

The second wiring layer 20 is a wiring layer formed on the lower surface of the second insulating layer 16, and has a wiring width of as small as approximately 20 μm to 50 μm as the above-described first wiring layer 18. The second wiring layer 20 is conducted to the lower surface of the conductive pattern 12 through interlayer connection parts 30 formed by penetrating the second insulating layer 16. To the second wiring layer 20, an external electrode made of a conductive adhesion material such as solder may be welded. Furthermore, by connecting the interlayer connection parts 30 with the metal core layer 12 serving as a heat sink, heat can be released to the outside through the connection parts. It is understood that the semiconductor elements 32 in FIG. 1(A) are connected to the metal core layer 12 and heat is thus released to the outside through the connection parts 28, the core layer 12 and the connection parts 30.

As a material of the above-described first wiring layer 18 and second wiring layer 20, a rolled conductive foil having copper, aluminum or the like as the main material, a plated film or a conductive foil formed by stacking the rolled conductive foil and a plated film can be used. The wiring layers are each formed by selectively etching a thin conductive film, and can be formed to be finer than the conductive pattern 12 serving as a metal core.

The interlayer connection parts 28 are each formed of a plated film provided in a hole formed in the insulating layer 14 while the interlayer connection parts 30 are each formed of a plated film provided in a hole formed in the insulating layer 16, and the interlayer connection parts function to connect the wiring layers and the conductive pattern. Here, the first wiring layer 18 and the conductive pattern 12 are connected with the interlayer connection parts 28 formed by penetrating the first insulating layer 14. Moreover, the second wiring layer 20 and the conductive pattern 12 are connected with the interlayer connection parts 30 formed by penetrating the second insulating layer 16. The interlayer connection parts may function as paths through which electric signals pass or may be so-called dummies through which no electric signal passes. In either case, the interlayer connection parts 28 can be used as thermal via holes through which heat passes. As a material of the interlayer connection parts 28 and the interlayer connection parts 30, a material other than a plated film, for example, a conductive adhesion material such as solder or silver paste, can also be used.

The above-described first wiring layer 18 and second wiring layer 20 can be conducted through the interlayer connection parts 28 and the like. In this case, the wiring layers are electrically connected through the following path: the first wiring layer 18→the interlayer connection parts 28→the conductive pattern 12→the interlayer connection parts 30→the second wiring layer 20.

The first wiring layer 18 and the second wiring layer 20 may be covered with solder resist made of a resin film, excluding portions to be externally connected and portions on which circuit elements are to be mounted. Here, as shown in FIG. 1(A), the second wiring layer 20, which is the lowermost layer, is almost totally covered with a resist 13, and the second wiring layer 20 is partially exposed from the resist 13 locally removed. Moreover, external electrodes 31 made of solder or the like are welded respectively to portions of a lower surface of the second wiring layer 20, the portions exposed from the resist 13. An upper surface of the first wiring layer 18 is covered with a resist 11, and circuit elements such as the semiconductor elements 32 are electrically connected to portions of the first wiring layer 18, the portions exposed from the resist 11 partially removed. The surfaces of the first wiring layer 18 and the second wiring layer 20 exposed from the resists may be covered with a gold plating film to improve their adhesiveness.

It is to be noted that multi-layered wiring including three layers—the first wiring layer 18, the conductive pattern 12 and the second wiring layer 20—is used here as an example; however, four or more wiring layers may be formed by further stacking wiring layers with an insulating layer therebetween.

The circuit device 10A of this embodiment is a SIP type including multiple circuit elements such as the semiconductor elements 32 and the chip element 34. For this reason, compared with a discrete type including a single semiconductor element, the circuit device 10A of this embodiment as a whole generates a great amount of heat, and hence includes a large-scale and complex electric circuit. Accordingly, the metal core layer can have functions besides that for improving heat dissipation, by separating the conductive pattern 12, serving as a metal core layer, to have different potentials. Hence, the device as a whole can have increased functionality and can be downsized.

Moreover, the conductive pattern 12 may be used as a pattern for improving heat dissipation by being thermally connected to the wiring layers through the interlayer connection parts 28 and the interlayer connection parts 30, the upper surfaces and the lower surfaces of which function as thermal vias. Here, the multiple interlayer connection parts 28 to function as thermal via holes are formed under each of the semiconductor elements 32, and the semiconductor element 32 is thermally connected to the conductive pattern 12 as a land disposed immediately under itself through the thermal via holes. With this configuration, even when high-power transistors generating a large amount of heat are used as the semiconductor elements 32, the large amount of generated heat can be successfully released to the outside through the thermal via holes and the conductive pattern 12. Further, under the conductive pattern 12, forming a land, the multiple interlayer connection parts 30 are formed, and thereby the conductive pattern 12, forming a land, and the second inter layer 20 under the conductive pattern 12 are thermally connected.

Figure 1B:
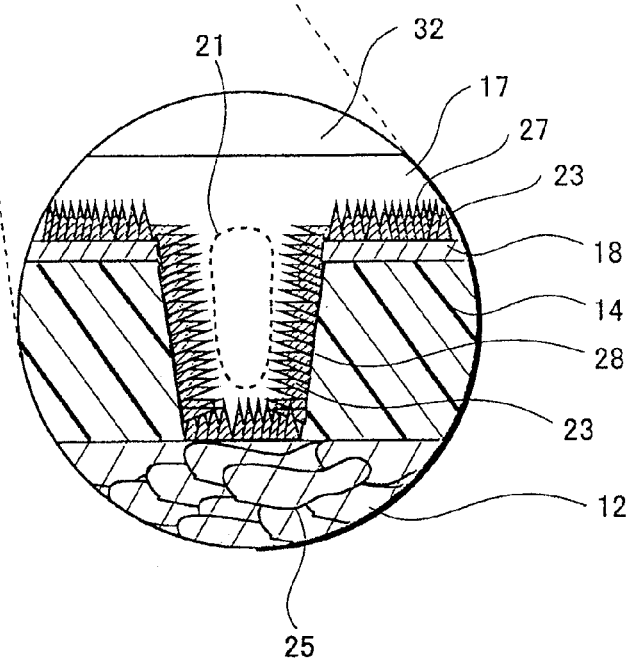

The materials of the interlayer connection parts 28 and the conductive pattern 12 will be described with reference to FIG. 1(B). In this embodiment, the conductive pattern 12, which is a metal core, is made of crystal grains 25, each of which is long in a parallel direction to a main surface direction, while the interlayer connections 28 are made of crystal grains 27, each of which is long in a perpendicular direction to the main surface direction. Especially by making the conductive pattern 12 with a rolled copper foil which is aggregate of the crystal grains 25, the thermal conductivity of the conductive patter 12 can be improved.

The interlayer connection parts 28 are each formed of plated films 23 attached to an inner wall of a hole part 21 formed by penetrating the first insulating layer 14 in a thickness direction, and around the hole. The thickness of each of the plated films 23 is approximately 2 μm to 10 μm, for example. Specifically, the plated films 23 are attached to a portion of the upper surface of the conductive pattern 12, the portion exposed at a bottom portion of the hole part 21, to a side wall of the hole part 21 formed of the first insulating layer 14, and around the hole 21. The plated films 23 are formed by growing the multiple crystal grains 27 to be multiple layers, by electroplating or electroless plating (or combination of both), and the multiple crystal grains 27 each have a long axis in a perpendicular direction to the corresponding surface. In other words, the multiple crystal grains 27 are each larger in the perpendicular direction to a main surface of the corresponding plated film 23 than in a parallel direction to the main surface of the plated film 23. For example, referring to FIG. 1(B), the crystal grains 27 forming the plated film 23 covering the upper surface of the conductive pattern 12 are each formed to be long in the perpendicular direction. The plated films 23 having such a structure are slightly poorer in thermal conductivity than metal made of a rolled film.

For this reason, by using a rolled film if available, a larger amount of heat can be released to the outside. The size and thickness of portable equipment such as phones have been becoming smaller. Accordingly, the equipment needs to be capable of releasing more heat than before while having a thickness reduced close to the limit. The use of a rolled film is suitable for such a case.

The conductive pattern 12 is formed by etching a rolled copper foil subjected to a rolling process as described above. The conductive pattern 12 has such a structure that the crystal grains 25 forming the conductive pattern 12 would each have its long axis in a parallel direction and would be stacked to form multiple layers. In other words, the majority of the multiple crystal grains 25 forming the conductive pattern 12 have shapes each of which is larger in the parallel direction to a main surface of the conductive pattern 12 than in a perpendicular direction to the main surface of the conductive pattern 12. By forming the conductive pattern 12, which is a metal core, from such a rolled copper foil having such a structure, the heat dissipation and the mechanical strength of the conductive pattern 12 can be improved.

Especially in this embodiment, although the interlayer connection parts 28 are made of a plated film, which is slightly poorer in thermal conductivity, excellent heat dissipation is achieved as a whole by using a rolled copper foil excellent in thermal conductivity, as a material of the conductive pattern 12. Further, as shown in FIG. 1(A), the conductive pattern 12, which is a metal core, is separated by the isolation grooves 22. Thus, compared with a solid metal core layer not subjected to patterning, the area of the conductive pattern 12 as a whole is smaller, possibly reducing thermal conductivity. In this embodiment, a reduction in heat dissipation as a whole is prevented by using a rolled foil as a material of the conductive pattern 12 and thereby improving the heat dissipation of the conductive pattern 12.

In addition, the interlayer connection parts 30 connecting the lower surface of the conductive pattern 12 and the second insulating layer 20 have the same structure as that of the interlayer connection parts 28 described above, and are each made of plated films provided on an inner wall of a corresponding hole part formed by penetrating the second insulating layer 16.

Next, a structure of each of the layers included in the above-described wiring board 45 will be described with reference to FIG. 2. FIG. 2(A) is a plan view of the first wiring layer 18; FIG. 2(B) is a plan view of the first wiring layer 18 on which the circuit elements are mounted; FIG. 2(C) is a plan view of the conductive pattern 12; and FIG. 2(D) is a plan view of the second wiring layer 20.

As shown in FIG. 2(A), the first wiring layer 18, positioned as the uppermost layer, forms die pads to which the circuit elements are fixed and bonding pats to which thin metal wires are connected. In each of the die-pad-shaped portions of the first wiring layer 18 on which circuit elements such as a semiconductor element are to be mounted, multiple (six, for example) interlayer connection parts 28 are formed, to thereby connect the first wiring layer 18 to the conductive pattern 12, forming a layer under the portion. Further, the first wiring layer 18 is covered with the resist 11 except for the regions to which the circuit elements are to be connected and the regions to which the thin metal wires are to be connected. Here, the region covered with the resist 11 is shown by hatching with dots. In each of the portions of the first wiring layer 18 to be die pads, the region on which a circuit element is to be mounted is exposed to the outside without being covered with the resist 11. Moreover, in each of the portions of the first wiring layer 18 to be bonding pads, the region to which a thin metal wire is to be connected is exposed to the outside without being covered by the resist 11, and the interlayer connection parts 28 are formed in the region covered with the resist.

As shown in FIG. 2(B), each of the semiconductor elements 32 and the chip element 34 is connected to the first wiring layer 18 having the above-described structure, with a conductive adhesive agent such as solder. The back surface of the semiconductor element 32 is fixed to the die-pad-shaped portion of the first wiring layer 18 with a conductive or insulative adhesion material. An electrode on the upper surface of the semiconductor element 32 is connected to the corresponding portion of the first wiring layer 18 functioning as a bonding pad, through a thin metal wire 19.

FIG. 2(C) shows an example of a planar shape of the conductive pattern 12 embedded in the wiring board 45. Here, the multiple portions of the conductive pattern 12 are separated by the isolation grooves 22 provided at approximately regular intervals. In other words, the portions of the conductive pattern 12 are electrically isolated (insulated) from each other by the isolation grooves 22 which are filled with the first insulating layer 14 and the second insulating layer 16 (see FIG. 1(A)). Accordingly, by connecting the conductive pattern 12 to the first wiring layer 18 through the interlayer connection parts 28 and to the second wiring layer 20 through the interlayer connection parts 30 (see FIG. 1(A)), the portions of the conductive pattern 12 can have different potentials. For example, the conductive pattern 12 may be used as a signal pattern through which electric signals to be inputted to or outputted from the first wiring layer 18 and the second wiring layer 20 pass, or may be used as a pattern to extract fixed potentials (power supply potential and ground potential, for example) at predetermined positions.

An outer peripheral end part of the conductive pattern 12, forming a metal core layer, is positioned inside an outer peripheral end part of the wiring board 45 formed of the first insulating layer 14 and the second insulating layer 16 (this outer peripheral end part is shown by a dotted line in the drawing). By thus positioning the outer peripheral end part of the conductive pattern 12 inside the outer peripheral end part of the wiring board 45, outermost side surfaces of the conductive pattern 12 can be covered with a resin material so as not to expose the side surfaces to the outside, thereby preventing a short circuit between the conductive pattern 12 and the outside. In other words, a structure in which all the portions of the conductive pattern 12 are covered with an insulating layer 51 so as not to be exposed to the outside is formed, consequently insulating the conductive pattern 12 from the outside. Moreover, in this embodiment, the first wiring layer 18 and the second wiring layer 20 are also positioned inside the outer peripheral end part of the wiring board.

As shown in FIG. 2(D), the second wiring layer 20 is covered with the resist 13 except for regions in which the external electrodes 31 are to be disposed on their lower surfaces. Here, the second wiring layer 20 is connected to the lower surface of the conductive pattern 12 through the interlayer connection parts 30 (see FIG. 1(A)).

In the above-described wiring board 45, the remaining ratios of the layers (ratios of the areas of the pattern or the wiring layers to the area of the entire substrate) are preferably set to be approximately the same. For example, the remaining ratio of each of the first wiring layer 18, the conductive pattern 12 and the second wiring layer 20 is set at approximately 80%±10%, preferably. By thus setting the remaining ratios of the layers to be approximately the same, warping of the wiring board 45 can be prevented in a step including heating such as a wire bonding step. When the metal core layer is a solid layer not subjected to patterning, the remaining ratios of the first wiring layer 18 and the second wiring layer 20 are set to be approximately the same within the above range.

Further, in consideration of the heat dissipation of the entire substrate, since the thermal conductivity of each of the first wiring layer 18 and the like is higher than that of each of the first insulating layer 14 and the like, the remaining ratio of each of the layers such as the first wiring layer 18 is preferably set higher. For example, the remaining ratio of each of the first wiring layer 18, the conductive pattern 12 and the second wiring layer 20 is preferably 50% or higher, more preferably 70% or higher, and particularly preferably 80% or higher. By setting the remaining ratio of each of the layers such as the first wiring layer 18 higher, steady thermal resistance can be reduced, successfully releasing heat generated from the circuit elements such as the semiconductor elements 32 to the outside through the wiring board 45.

Next, a configuration of a circuit device 10B of another example will be described with reference to FIG. 3. The configuration of the circuit device 10B is different from the above-described circuit device in that a sealing resin 33 is included therein. Here, the sealing resin 33 is formed to cover the chip element 34, the semiconductor element 32 and the upper surface of the wiring board 45. The sealing resins 33 is formed by injection molding using thermoplastic resin, transfer molding using thermosetting resin, potting or the like.

Second Embodiment

In this embodiment, a method of manufacturing the circuit device 10A in FIG. 1 will be described with reference to FIG. 4 to FIG. 6. In the case of manufacturing the circuit device 10B shown in FIG. 3, the step of forming sealing resin is required in addition to the following steps.

Figure 4A:
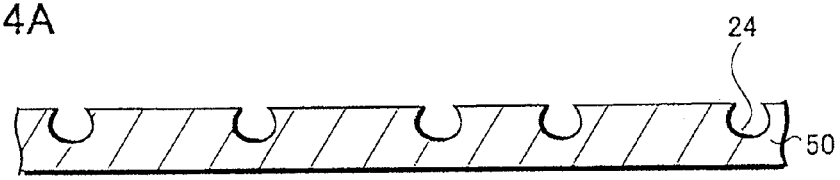
FIG. 4 includes views showing a method of manufacturing the circuit device of the present invention, (A) to (D) being cross-sectional views.

As shown in FIG. 4(A), firstly, by partially etching a surface of a conductive foil 50, the first isolation grooves 24 are formed. The conductive foil 50 is made of metal or alloy having copper or aluminum as a main material, and has a thickness of approximately 100 μm to 200 μm, for example. Since rolled metal is excellent in mechanical strength, cracking and deformation of the substrate can be prevented in the manufacturing steps. The concrete composition of the rolled metal forming the conductive foil 50 is the same as that of the conductive pattern 12 described in the first embodiment. Further, since rolled metal has higher thermal conductivity than a plated film, the heat dissipation of each of the wiring board and the entire circuit device can be improved.

Here, after the upper surface of the conductive foil 50 except for regions in which the first separation grooves 24 are to be formed is covered with resist (not illustrated), etching is performed on the conductive foil 50 from the upper surface by using the resist as an etching mask. In this step, the conductive foil 50 is subjected to wet etching using etchant containing iron chloride or copper chloride.

The depth of each of the first isolation grooves 24 formed in this step is preferably approximately half the thickness of the conductive foil 50. Thereby, the isolation grooves 22 can be formed of the first isolation grooves 24 and the second isolation grooves 26 formed by isotropic wet etching, and hence the width of each of the isolation grooves 22 can be as small as approximately half the depth of the isolation groove (see FIG. 4(C)). Consequently, the ratio of the area of the conductive pattern to that of the entire wiring board increases, thereby improving the mechanical strength and the heat dissipation of the wiring board.

For example, when the thickness of the conductive foil 50 is in the range between 100 μm and 200 μm, the depth of each of the first isolation grooves 24 may be approximately 50 μm to 100 μm. Further, in consideration that the wet etching progresses isotropically in this step, the width of each of the first isolation grooves 24 is set to be between 50 μm and 100 μm depending on the thickness of the conductive foil 50.

After the first isolation grooves 24 are formed in the above-described step, the unillustrated resist used as the etching mask is separated and removed from the conductive foil 50.

Figure 4B:
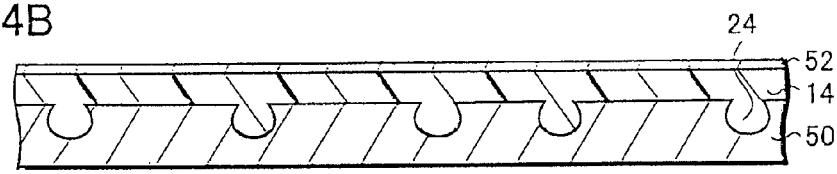

Next, as shown in FIG. 4(B), the upper surface of the conductive foil 50 is covered with the first insulating layer 14 so that the first separation grooves 24 would be filled with the first insulating layer 14, and then a first conductive film 52 is adhered to an upper surface of the first insulating layer 14. As a method of forming the first insulating layer 14, a semisolid or liquid resin material may be applied to the upper surface of the conductive foil 50 and then hardened by heat, or a film resin material may be closely attached to the upper surface of the conductive foil 50 by vacuum press. In this step, since the first isolation grooves 24 end in the middle of the conductive foil 50 in a thickness direction without penetrating the conductive foil 50, such a problem that the resin material would leak from the first isolation grooves 24 does not occur even when the first isolating layer 14 which is liquid or semisolid is applied to the conductive foil 50.

Since side surfaces of the first isolation grooves 24 are curved surfaces formed by wet etching, the first insulating layer 14 is engaged with the side surfaces of the first isolation grooves 24, and hence the adhesion strength therebetween is high.

Moreover, the entire upper surface of the first insulating layer 14 is covered with the first conductive film 52. Here, the first insulating layer 14 to which the first conductive film 52 is adhered may be stacked on the conductive foil 50, or the first conductive film 52 may be adhered to the first insulating layer 14 after the first insulating layer 14 is closely attached to the conductive foil 50. The first conductive film 52 may be made of rolled metal or may be formed by plating. The thickness of the first conductive film 52 is approximately 20 μm to 50 μm, for example. Further, the first conductive film 52 may be formed as a plate film together with the interlayer connection parts in the step of forming the interlayer connection parts to be described later.

Here, as the resin material forming the first insulating layer 14, thermosetting resin or thermoplastic resin may be used. Alternatively, a resin material into which fibrous or particulate filler is mixed may be used for the first insulating layer 14. The thickness of the first insulating layer 14 covering the upper surface of the conductive foil 50 is approximately 50 µm to 100 µm, for example.

Figure 4C:
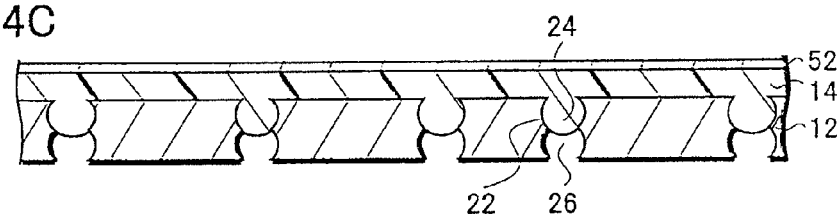

Next, as shown in FIG. 4(C), by selectively etching the conductive foil 50 from a back surface, the second isolation grooves 26 are formed. Thereby, the conductive foil 50 is sectioned, and consequently the portions of the conductive pattern 12 are obtained. As a concrete method, firstly, resist (not illustrated) is formed so as to expose regions of the back surface of the conductive foil 50, the regions corresponding to the first isolation grooves 24. Then, by performing wet etching on the regions of the back surface of the conductive foil 50 to be exposed from the unillustrated resist, the second isolation grooves 26 are formed. Here, wet etching is performed to form the second isolation grooves 26 until the first insulating layer 14 filled in each of the first isolation grooves 24 is exposed.

The total length of the depths of each of the first isolation grooves 24 and the corresponding second isolation groove 24 needs to be equal to or larger than the thickness of the conductive foil 50 to be able to reliably expose the first insulating layer 14 from the second isolation grooves 26.

Through the above-described step, the conductive pattern 12 having a shape shown in FIG. 2(C) is obtained.

Here, the second isolation grooves 26 do not necessarily be formed. For example, the first insulating layer 14 filled in the first isolation grooves 24 may be exposed at the bottom by entirely removing the conductive foil 50 from the back surface without using any etching mask in this step. In this case, the conductive pattern 12 is separated only by the first isolation grooves 24. However, by forming the isolation grooves 22 by the first isolation grooves 24 and the second isolation grooves 26 as described above, the parallel direction width of each of the isolation grooves 22 can be small, and the conductive pattern 12 larger in thickness can be obtained.

Figure 4D:
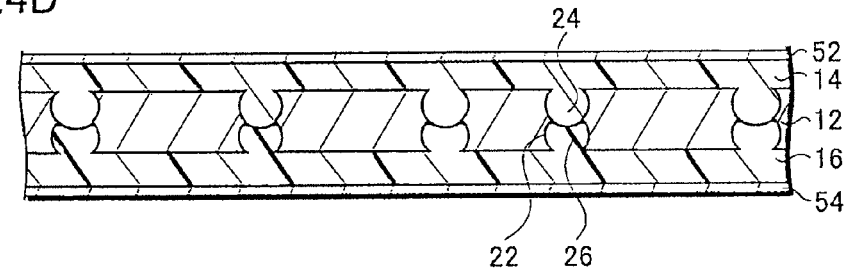

Next, as shown in FIG. 4(D), the back surface of the conductive pattern 12 is covered with the second insulating layer 16, and a second conductive film 54 is adhered to the surface of the second insulating layer 16. Here, the second insulating layer 16 is formed so that the lower surface of the conductive pattern 12 would be covered and the second separation grooves 26 would be filled. The thickness, the composition and the formation method of the second insulating layer 16 may be the same as those of the above-described first insulating layer 14. Moreover, the thickness, the composition and the formation method of the second conductive film 54 formed on the lower surface of the second insulating layer 16 may be the same as those of the first conductive film 52. For example, the second conductive film 54 may be formed together with the interlayer connection parts in the step to be described later, instead of in this step.

Figure 5A:
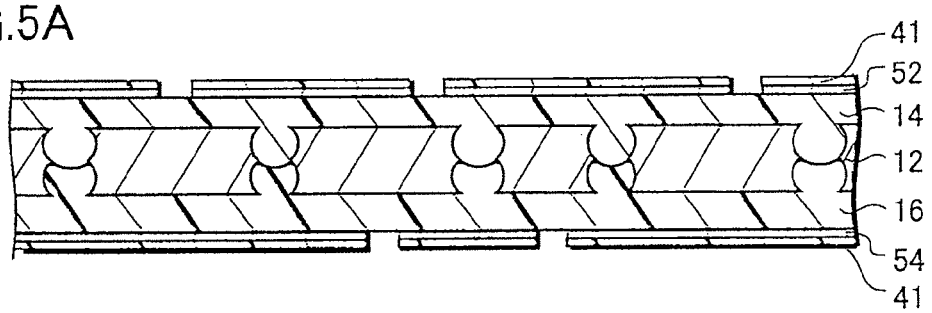
FIG. 5 includes views showing the method of manufacturing the circuit deice of the present invention, (A) to (C) being cross-sectional views, (D) being an enlarged cross-sectional view.

Next, as shown in FIG. 5(A), regions of the first conductive film 52 and the second conductive film 54 to be connected to the conductive pattern 12 are partially removed. Specifically, after applying a resist 41 functioning as an etching mask to the entire upper surface of the first conductive film 52, an exposure/development process is performed thereon to expose the regions of the surface of the first conductive film 52 to be connected to the conductive pattern 12. Then, the first conductive film 52 exposed from the resist 41 is removed by wet etching. The same step is also performed on the second conductive film 54, and the second conductive film 54 is partially removed. After the completion of this step, the resist 41 is separated and then removed.

Figure 5B:
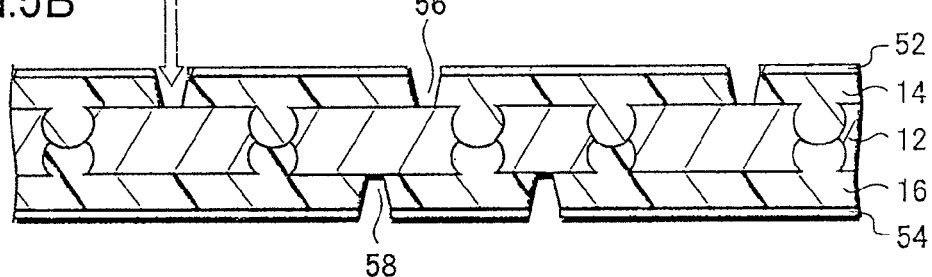

Next, as shown in FIG. 5(B), a laser process is performed by using the first conductive film 52 as a mask to remove the portions of the first insulating layer 14 exposed from the exposure portions of the first conductive film 52. Thereby, exposure holes 56 are formed. Here, to expose the upper surface of the conductive pattern 12 from the bottom parts of the exposure holes 56, portions of the first insulating layer 14 exposed from the first conductive film 52 are etched by laser. Moreover, in this step, portions of the second insulating layer 16 exposed from the second conductive film 54 are removed. Thereby, exposure holes 58 exposing, from their bottom parts, the conductive pattern 12 are formed. If residual such as an evaporated resin material is remaining at the bottom parts of the exposure holes 56 and the like due to laser irradiation in this step, the residual is removed by a desmear process. A side wall of each of the exposure holes 56 and the like formed in this step is such an inclined plane that the opening area increases toward the outside. This results in advantages, in the next step of performing a plating process, that the flow of plating solution inside each of the exposure holes 56 is accelerated and a plated film can easily be attached to the inner wall of the exposure hole 56.

Figure 5C:
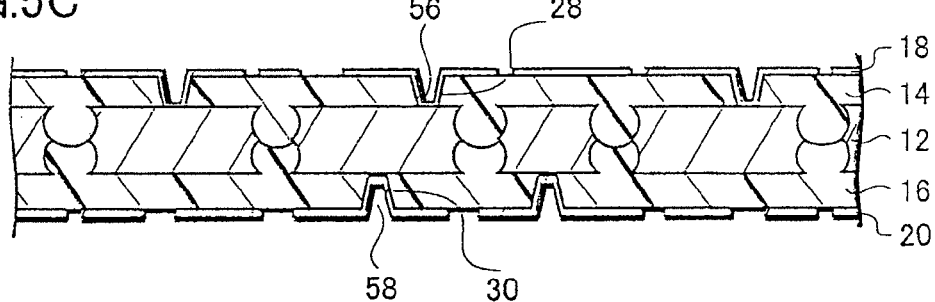

Next, as shown in FIG. 5(C), the interlayer connection parts 28 and the like are formed respectively in the exposure holes 56, thereby establishing conduction between the wiring layers and the conductive pattern. The interlayer connection parts 28 may be made of a metal film formed inside each of the exposure holes 56 by plating, or may be formed by embedding a conductive material such as solder or conductive resin paste into the exposure holes 56. When the interlayer connection parts 28 are formed by plating, first, a thin metal film (seed layer) is formed on at least an inner wall of each of the exposure holes 56 by electroless plating, voltage is applied to the seed layer, and a plated film made of copper having a thickness of approximately several µm is then formed by electroplating. By the same method, interlayer connection parts 30 are formed respectively on inner walls of the exposure holes 58 penetrating the second insulating layer 16. By performing filling plating, plated films can be generated so that the exposure holes 56 and the exposure holes 58 would be filled. In this step, the upper surfaces of the first conductive film 52 and the second conductive film 54 are also covered with the plated films at the time of forming the interlayer connection parts 28 and 30, thereby increasing the thickness. Moreover, the first conductive film 52 and the second conductive film 54 made of plated films may be formed together with the interlayer connection parts 28 and 30. In this case, the first conductive film 52 and the like each having a small thickness are formed, and hence fine wiring can be formed.

After the interlayer connection parts 28 and 30 are formed, the first conductive film 52 and the second conductive film 54 are selectively etched, and the first wiring layer 18 and the second wiring layer 20 are then patterned. The first conductive film 52 and the second conductive film 54 each have a small thickness of, for example, approximately 10 µm, and can each accordingly have a fine wiring width of approximately 20 µm to 50 µm.

Here, multi-layered wiring with three layers is formed by stacking the first wiring layer 18 above the conductive pattern 12 and stacking the second wiring layer 20 under the conductive pattern 12. However, four or more wiring layers may be used by stacking more wiring layers with insulating layers therebetween. By increasing the number of wiring layers to be stacked, a larger-scale electric circuit can be embedded into the wiring board.

Figure 5D:
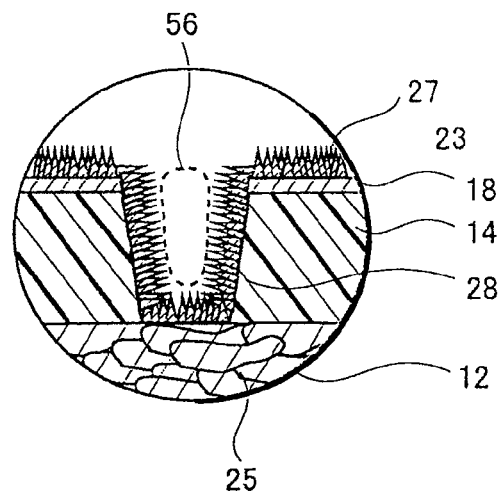

The interlayer connection parts 28 formed in the above-described step will be described in detail with reference to FIG. 5(D). The interlayer connection part 28 is formed by forming plated films 23 so that the plated films 23 would cover at least the bottom surface and the side surface of the exposure hole 56 formed by partially penetrating the first insulating layer 14. Moreover, in this step, the upper surface of the first wiring layer 18 (first conductive film 52) is also covered with the plated films 23, thus increasing the thickness. As described in the first embodiment, each of the crystal grains 27 forming the plated films 23 has the long axis in the perpendicular direction to the surface to which the plated film 23 is attached. Since the plated films 23 are less fine than rolled metal, the thermal resistance of the interlayer connection parts 28 is slightly higher. By contrast, the conductive pattern 12 is made of rolled metal as described above, and each of the crystal grains 25 forming the conductive pattern 12 has the long axis in a parallel direction to the main surface direction of the conductive pattern 12. In other words, the crystal grains 25 each have a shape larger in the parallel direction to the main surface of the conductive pattern 12 than in the perpendicular direction to the main surface of the conductive pattern 12. With this structure, the conductive pattern 12 can be excellent in mechanical properties such as flexibility and also excellent in thermal conductivity.

After the above-described step, the first wiring layer 18 and the second wiring layer 20 may be covered with solder resist made of a resin film except for portions on which circuit elements are to be mounted and which are to be connected to the outside.

Figure 6:
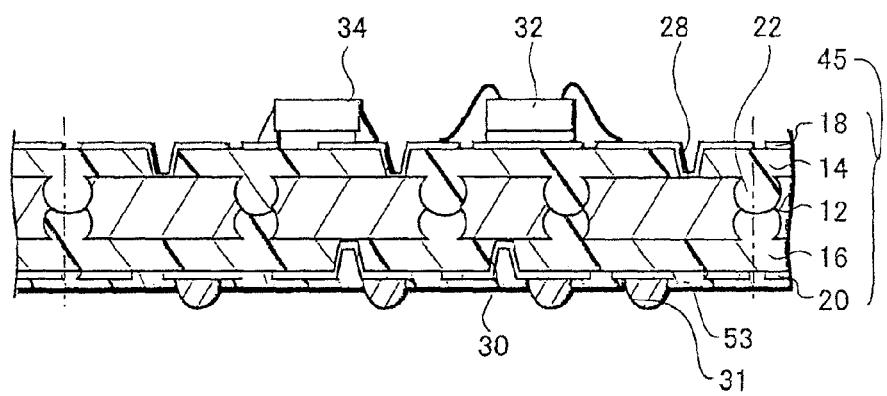
FIG. 6 is a cross-sectional view showing the method of manufacturing the circuit device of the present invention.

Next, as shown in FIG. 6, the circuit elements are mounted on and thereby electrically connected to the first wiring layer 18. Here, the chip element 34 is connected to the first wiring layer 18 with an adhesion material such as solder. Moreover, the semiconductor element 32 such as an LSI is mounted on the first wiring layer 18, forming a land, with an adhesion material interposed between the back surface of the semiconductor element 32 and the first wiring layer 18, and an electrode on the top surface of the semiconductor element 32 is connected to the first wiring layer 18 through thin metal wirings.

After the resist 53 is formed to cover the second wiring layer 20, the resist 53 is partially removed to expose portions of the wiring layer 20, and the external electrodes 31 made of solder are welded to the portions of the second wiring layer 20 thus exposed. Thereafter, the wiring board 45 is separated into units at the positions indicated by alternate long and short dashed lines. Alternatively, the separating step may be performed after sealing resin is formed on the upper surface of the wiring board 45 to cover the semiconductor element 32 and the like. In this step, the portions of the wiring layer exposed from the resist 53 may be covered with a gold plating film.

In this step, since the wiring board 45 is separated at the positions where the isolation grooves 22 are formed (that is, at positions where none of the conductive pattern 12, the first wiring layer 18 nor the like is provided), the division can be performed with suppressed wear of cutting means such as a dicing saw. Moreover, since the division is not performed on any conductive material such as copper, occurrence of burr due to the division can also be suppressed.

Through the above-described steps, the circuit device 10A having the configuration shown in FIG. 1 can be manufactured, for example.

Although the wiring layers are formed by etching conductive films (the first conductive film 52 and the second conductive film 54) in a film form in the above description, plated films may be used instead of conductive films. In this case, the exposure holes 56 and the like shown in FIG. 5(B) are formed without forming the first conductive film 52 and the second conductive film 54, and then metal films to cover the first insulating layer 14 and the second insulating layer 16 are formed by plating. Thereafter, by selectively etching the metal films, the first wiring layer 18 and the second wiring layer 20 shown in FIG. 5(C) are formed. By means of this manufacturing method in which the wiring layers are formed of plated films, the wiring layers are formed by etching the thin metal films each having a thickness of approximately 5 µm to 10 µm. Hence, fine wiring layers each having a width of approximately 40 µm or smaller can be formed.

Third Embodiment

Figure 7A:
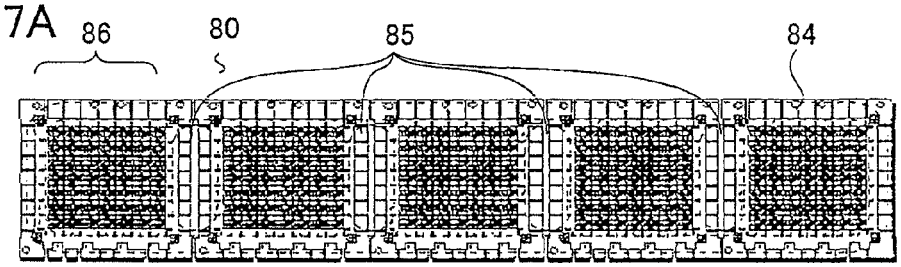
FIG. 7 includes views showing a structure of a plate-like body usable in the manufacturing method of the present invention, (A) and (B) being plan views, (C) and (D) being cross-sectional views.
Figure 7B:
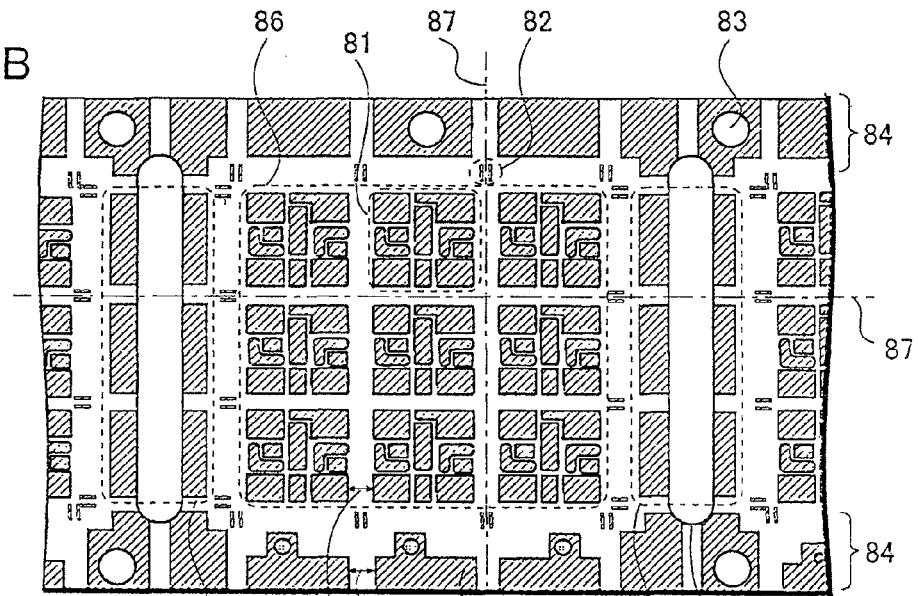
Figure 7C:
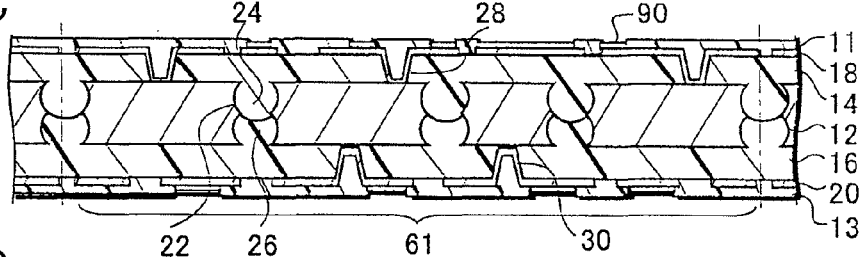
Figure 7D:
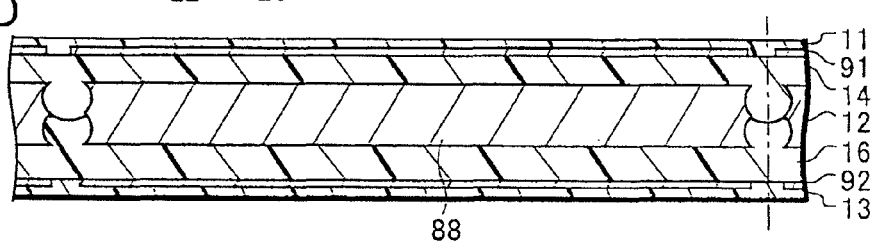
Figure 8:
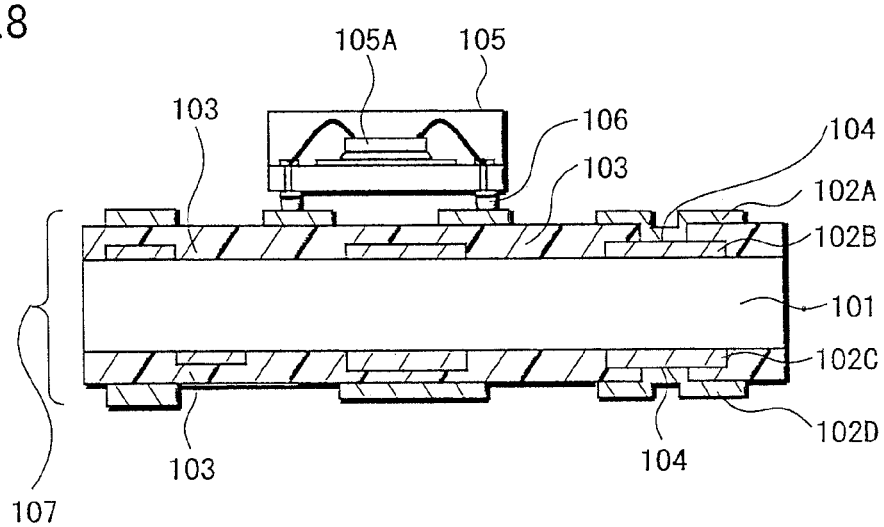
FIG. 8 is a cross-sectional view showing a structure and a manufacturing method of a multi-layered substrate of background art.

In this embodiment, a structure of a plate-like body 80 used as a material of the above-described wiring board 45 in the actual manufacturing steps will be described. FIG. 7(A) is a plan view showing the entire plate-like body 80; FIG. 7(B) is an enlarged plan view of one of blocks 86 included in the plate-like body 80; FIG. 7(C) is a cross-sectional view of a portion of the plate-like body 80, the portion being inside the block 86; FIG. 7(D) is a cross-sectional view of a portion of the plate-like body 80, the portion being in a supporting unit.

As shown in FIG. 7(A), the plate-like member 80 of this embodiment is formed by stacking multiple wiring layers on the upper and lower surfaces of the metal core layer 12 in the middle with the insulating layer interposed between each of the surfaces and the corresponding one of the wiring layers. The plate-like member 80 has a strip shape in which the multiple blocks 86 are disposed in a matrix while being spaced apart from each other. Moreover, the blocks 86 are joined by the supporting unit, thereby formed as a single plate. The supporting unit includes: first supporting parts 84 supporting, as a frame, the multiple block 86 from the outer sides; and second supporting parts 85 each positioned between adjacent blocks 86 and joining the blocks 86. Here, five blocks 86 are disposed at regular intervals in the single plate-like member 80. However, multiple blocks 86 may be disposed in a matrix inside the plate-like body 80, instead.

FIG. 7(B) is a plan view showing one of the blocks 86 in an enlarged manner. In this drawing, the regions shown by hatching with oblique lines are portions made of a conductive material such as copper, the regions shown by hatching with small dots are regions from which portions of the insulating layers are exposed, the portions being between each two adjacent wiring layers, and the regions shown by hollow shapes are portions in which the plate-like body 80 is removed so as to be penetrated in a thickness direction.

The block 86 is formed of multiple units 81 disposed at regular intervals in a matrix. Here, each of the units 81 is a part to form a single circuit device. In the drawing, the single block 86 is formed of nine units 81 in total: three units 81 in each row and three units 81 in each column. Here, any number of units 81 can be disposed in the single block 86, and several tens to several hundreds of units 81 may be disposed in the single block 86. A distance (L1) at which each two units 81 are spaced apart from each other is approximately 100 µm to 500 µm, for example.

As described above, the blocks 86 are supported by the supporting unit. Specifically, the upper side ends and the lower side ends of the blocks 86 are supported by the first supporting parts 84. Moreover, the left side ends and the right side ends of the blocks 86 are supported by the second supporting parts 85. As the blocks 86, each of the supporting parts is formed by stacking the conductive layers made of a conductive material with the insulating layers. This structure will be described later with reference to FIG. 7(D).

Slits 89 are formed of portions of the plate-like body 80, the portions corresponding to the regions provided with the second supporting parts 85. With the slits 89, even when thermal stress occurs due to heating of the plate-like body 80 in the molding step or the mounting step, the slits 89 deform to absorb the stress, thereby reducing the deformation amount of the plate-like body 80.

Through-holes 83 are formed to be circular by penetrating, in the thickness direction, the plate-like body 80 at the regions provided with the first supporting parts 84. The through-holes 83 are used in positioning and transporting the plate-like body 80 at the time of manufacturing circuit devices. For example, by inserting projection parts of a circuit device manufacturing machine into the through-holes 83 thereby moving the plate-like body 80, the plate-like body 80 can be transported or positioned. Here, the through-holes 83 are formed by penetrating the regions provided with conductive films 88 of the first supporting parts 84.

Alignment marks 82 are formed of portions of the uppermost or lowermost wiring layer, and are used for alignment when the units 81 are divided in a step of manufacturing circuit devices. Here, two alignment marks 82 are provided to sandwich, from both sides, each extended line 87 of boundaries of the units 81 at the periphery of the blocks 86. Here, the alignment marks 82 each have a rectangular shape, and the longitudinal direction of each of the alignment marks 82 is parallel with the direction in which the corresponding extended line 87 extends. By providing the alignment marks 82 to correspond with the boundaries of the units 81, positioning accuracy at the time of dividing the units 81 can be improved.

As described above, the first supporting parts 84 and the second supporting parts 85 are each formed of stacked conductive films with insulating layers. The stacking structure of the supporting parts (composition and thickness of each of the conductive films and the insulating layers) is the same as that in the blocks 86. The conductive films 88 included in the first supporting parts 84 and the second supporting parts 85 are removed around the extended lines 87 extending the boundaries of the units 81 of each of the blocks 86. In other words, in the first supporting parts 84 and the second supporting parts 85 near the extended lines 87, only the insulating layers each interposed between the conductive films remain, and the conductive films 88 of all the layers are removed. Here, in the first supporting parts 84 and the second supporting parts 85, a distance (L2) between each two adjacent portions of the conductive films 88 may be equal to the distance (L1) between each two adjacent units 81 in the block 86, and is thus approximately 100 µm to 500 µm, for example.

As shown in FIG. 7(C), the cross section of each of the units 81 is formed of: the thick conductive pattern 12 serving as a metal core layer; the first wiring layer 18 formed on the upper surface of the first insulating layer 14 covering the upper surface of the conductive pattern 12; and the second wiring layer 20 formed on the lower surface of the second insulating layer 16 covering the lower surface of the conductive pattern 12.

The conductive pattern 12 serves as a metal core layer having sufficient mechanical strength and improving thermal dissipation. Accordingly, the conductive pattern 12 is formed thicker than any of the other wiring layers, and has a thickness of approximately 100 µm to 200 µm, for example. As a material of the conductive pattern 12, metal containing copper as the main material, metal containing aluminum as the main material, alloy or the like can be used. When rolled metal such as rolled copper foil or the like is used as a material of the conductive pattern 12, the mechanical strength and the thermal dissipation of the conductive pattern 12 can be further improved. Rolled metal has higher thermal conductivity than a plated film by approximately several percent.

The conductive pattern 12 is separated into portions at predetermined intervals by the isolation grooves 22 each including the first separation groove 24 and the second separation groove 26. The width of each of the separation grooves 22 is approximately 100 µm to 300 µm, for example. The first separation grooves 24 are formed by selectively half-etching the conductive foil, which is the material of the conductive pattern 12, from the upper surface, while the second separation grooves 26 are formed by selectively half-etching the back surface of the conductive foil. Moreover, the first separation grooves 24 are filled with the first insulating layer 14 covering the upper surface of the conductive pattern 12, while the second separation grooves 26 are filled with the second insulating layer 16 covering the lower surface of the conductive pattern 12.

Since the conductive pattern 12 is formed of rolled metal as described in the first embodiment and the second embodiment, the mechanical strength of the plate-like body 80 is improved, and hence the thermal dissipation of each circuit device formed by using the plate-like body 80 as a material is also improved.

Moreover, the separation grooves 22 can be classified into those provided between the portions of the conductive pattern 12 in each of the units 81 and those provided between the units 81. The separation grooves 22 provided between the units 81 may be formed larger in width than the separation grooves 22 formed in each of the units 81.

The first insulating layer 14 covers the upper surface of the conductive pattern 12, while the second insulating layer 16 covers the lower surface of the conductive pattern 12. The first insulating layer 14 is filled in the first separation grooves 24, while the second insulating layer 16 is filled in the second separation grooves 26. The thickness of each of the first insulating layer 14 and the second insulating layer 16 covering the conductive pattern 12 is approximately 50 µm to 100 µm, for example. As a material of the first insulating layer 14 and the second insulating layer 16, thermosetting resin such as epoxy resin or thermoplastic resin such as polyethylene resin can be used.

Further, by using a resin material into which fibrous or particulate filler is mixed, as a material of the first insulating layer 14 and the second insulating layer 16, the thermal resistance of each of the resin layers decreases, thereby improving the heat dissipation of the wiring board 45. Silicon oxide or silicon nitride can be used as a material of the filler. By mixing such filler into the first insulating layer 14 and the second insulating layer 16, the thermal expansion coefficient of each of the insulating layers becomes closer to that of the conductive material of the conductive pattern 12 and the like, thereby stopping the plate-like body 80 from warping due to effects of temperature change. In addition, by improving the mechanical strength of the plate-like body 80 (especially, the mechanical strength of each of the first supporting parts 84 and the second supporting parts 85), deformation of the plate-like body 80 can be prevented in the steps of manufacturing circuit devices.

The first wiring layer 18 is a wiring layer formed on the upper surface of the first insulating layer 14, and is formed by selectively etching a conductive film or a plated film adhered to the first insulating layer 14. The first wiring layer 18, patterned by etching a thin conductive film, can be formed to be fine, and has a wiring width of as small as approximately 20 µm to 50 µm. The first wiring layer 18 is electrically connected to the conductive pattern 12 through the interlayer connection parts 28 formed by penetrating the first insulating layer 14.

The second wiring layer 20 is a wiring layer formed on the lower surface of the second insulating layer 16, and has a wiring width of as small as approximately 20 μm to 50 μm as the above-described first wiring layer 18. The second wiring layer 20 is conducted to the lower surfaces of the conductive pattern 12 through the interlayer connection parts 30 formed by penetrating the second insulating layer 16. To the second wiring layer 20, an external electrode made of a conductive adhesion material such as solder may be welded.

The interlayer connection parts 28 and the interlayer connection parts 30 are each formed of a conductive material such as a plated film provided in a through-hole formed in the corresponding insulating layer, and function to connect the wiring layers and the conductive pattern 12. Here, the first wiring layer 18 and the conductive pattern 12 are connected with the interlayer connection parts 28 formed by penetrating the first insulating layer 14. Moreover, the second wiring layer 20 and the conductive pattern 12 are connected with the interlayer connection parts 30 formed by penetrating the second insulating layer 16. The interlayer connection parts may function as paths through which electric signals pass or may be so-called dummies through which no electric signal passes. Even when the interlayer connection parts 28 and the like are those not allowing electric signals to pass, the interlayer connection parts can be used as thermal via holes through which heat passes.

The above-described first wiring layer 18 and second wiring layer 20 can be conducted through the interlayer connection parts 28 and the like. In this case, the wiring layers are electrically connected through the following path: the first wiring layer 18→the interlayer connection parts 28→the conductive pattern 12→the interlayer connection parts 30→the second wiring layer 20. Alternatively, the first insulating layer 18 and the second insulating layer 20 may be connected by forming through-holes penetrating portions of the insulating layers filled in the isolation grooves 22 and filling the through-holes with a conductive material (through-hole electrodes), instead of being connected via the conductive pattern 12.

The first wiring layer 18 and the second wiring layer 20 may be covered with resist (solder resist), excluding portions to be externally connected and portions on which circuit elements are to be mounted (electrically connected regions). Here, the second wiring layer 20, which is the lowermost layer, is almost entirely covered with the solder resist 13, and, by partially removing the resist 13, the second wiring layer 20 is partially exposed from the resist 13. The lower surfaces of the first wiring layer 18 and the second wiring layer 20 exposed from the resist 13 may be covered with a plating film such as a gold plating film.

In addition, multi-layered wiring including three layers—the first wiring layer 18, the conductive pattern 12 and the second wiring layer 20—is used here as an example, however, four or more wiring layers may be formed by further stacking wiring layers with an insulating layer therebetween.

Further, multiple wiring layers are formed of the first conductive layer 18, the conductive pattern 12 and the second wiring layer 20 in this embodiment, and the layers have different shapes on the basis of their functions. Specifically, the first wiring layer 18 is patterned to have a predetermine shape on the basis of the circuit elements to be mounted on the upper surface and an electric circuit to be formed. The conductive pattern 12 may be a solid shape, not subjected to patterning, or may be separated so that multiple regions having different potentials may be formed. The second wiring layer 20 is patterned so that pad-shaped regions to which multiple external electrodes are to be welded would be formed.

FIG. 7(D) is a cross-sectional view of one of the first supporting parts 84 and the second supporting parts 85. A structure of this cross section is basically the same as that shown in FIG. 7(C), but is different in patterning shape. Here, only portions of a first conductive film 91, the conductive pattern 12 and a second conductive film 92 are removed, the portions being in regions corresponding to the extended lines 87 shown in FIG. 7(B), and portions thereof in the other regions are not removed. By removing the portions of the first conductive film 91 and the like near the regions corresponding to the extended lines 87 as described above, occurrence of burr and wear of a dicer can be suppressed even when the first supporting parts 84 and the second supporting parts 85 are cut together with the blocks 86. Further, the portions of the first conductive film 91 and the like in the other regions are not removed and remain in a solid state. Accordingly, the ratio of the conductive material excellent in mechanical strength in the first supporting parts 84 and the second supporting parts 85 can be high, and thus the mechanical strength of the entire supporting unit and the entire plate-like body 80 can be improved.

By using the plate-like body having the above-described structure in the method of manufacturing the circuit device, the insulating materials of only the first insulating layer 14 and the like are cut by a dicer for cutting, without cutting the metal materials of the first wiring layer 18 and the like, even when the plate-like body 80 is cut at the portions corresponding to the extended lines 87 in FIG. 7(B). Accordingly, even when the plate-like body 80 entirely adhered to a dicing sheet is cut without separating the blocks 86 from the supporting parts of the plate-like body 80, wear of the dicer and occurrence of burr can be suppressed.

As shown in FIG. 7(A) and FIG. 7(B), the units 81 included in the blocks 86 are aligned in a direction of a shorter side of the plate-like body 80. Accordingly, the extended lines 87 extending in a direction of a longer side in FIG. 7(B) are commonly used for the multiple blocks 86 disposed in the plate-like body 80. In other words, in dicing along the extended lines 87 extending in the direction of the longer side on the sheet, the units 81 included in all the blocks 86 included in the plate-like body 80 can be separated by performing dicing once. Thus, the step of separating the units 81 can be simplified.

Next, application examples will be described.

Figure 9A:
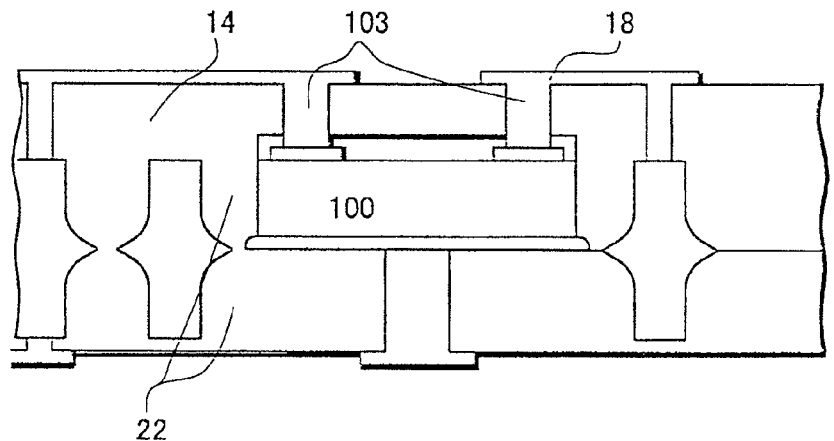
FIG. 9 includes views illustrating a structure in which a circuit element is embedded in an isolation groove.
Figure 9B:
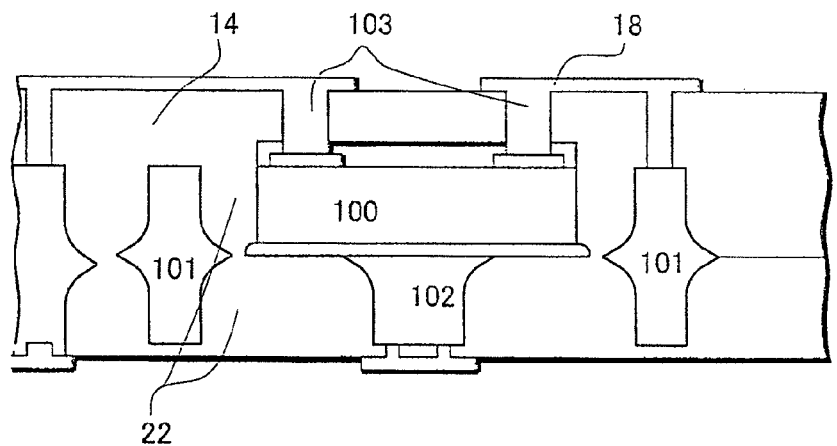

FIG. 9 shows an example in which an LSI or a chip element 100 is embedded in the separation groove 22. After each of the first separation grooves 24 shown in FIG. 4(A) is formed, the element is adhered to a bottom surface of the groove with an adhesion material. Then, the first insulating resin 14 and the first conductive film 52 are formed as shown in FIG. 9(B), and then the same holes as the interlayer connection parts are formed. The holes expose electrode pads of the LSI element, and form connection wiring together with the first wiring layer 18, thereby forming a circuit. In FIG. 9(A), since the second separation grooves 26 are formed as shown in FIG. 4(C), no metal core material is provided on a back surface of the chip element 100.

Figure 9C:
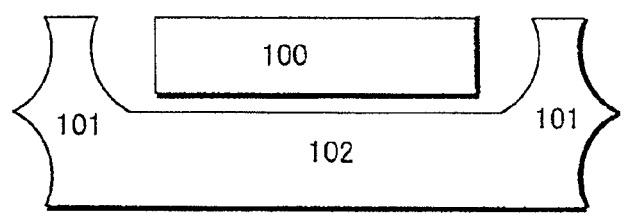

FIG. 9(B) is an example in which a metal core material is provided on the back surface of the chip element 100. This is formed by leaving a core material 102 corresponding to the back surface of the chip in FIG. 4(C). The core material 102 under the chip element 100 serves as a heat sink. Moreover, a core member 101 having upper and lower separation grooves surrounds the entire periphery of the chip 100, and the core material 102 is provided under the chip element 100, thereby protecting the chip element 100. A reduction in thickness of the chip element 100 may cause cracks in the chip element 100. However, by providing the core materials on the side surfaces and the bottom surface of the chip element 100, low mechanical strength of the chip can be compensated. Alternatively, the core materials denoted by the symbols 101 and 102 may be integrally formed as shown in FIG. 9(C).

As shown in FIG. 9(A) and FIG. 9(B), the chip element 100 is covered with the insulating layer, and is electrically connected to other circuit elements through holes 103.

Figure 10:
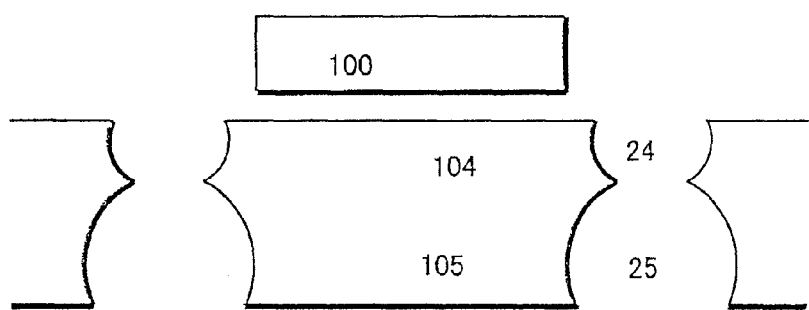
FIG. 10 is a view illustrating a state in which isolation grooves formed in an upper part and lower part of a metal core layer are different in size.

FIG. 10 is a view focusing only on the metal core layer 12. Here, the depth of each of the upper separation grooves 24 and the depth of each of the lower separation grooves 26 are different. One of the separation grooves is larger in both width and depth than the other separation groove. In FIG. 10, the separation groove 24 is smaller in both depth and width. Thus, since the separation groove is smaller, the plane size of a core layer upper part 104 results in being larger than that of a lower part 105. In this manner, a conductive pattern having a plane size substantially equal to a chip size can be disposed on the back surface of the chip element 100, making it possible to transmit heat of the chip element 100 to the core layer. If the positions of the separation grooves are reversed, the core layer lower part becomes larger than the chip size, consequently increasing the size of the entire substrate. However, if the groove 25 larger in size is formed on the upper side, the circuit element to be embedded in a groove can be larger in thickness and plane size.

Figure 11A:
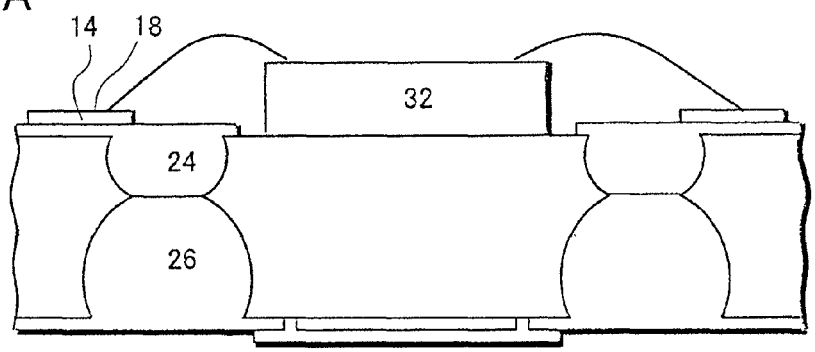
FIG. 11 includes views illustrating a method of thermal bonding of a semiconductor element to be mounted on a substrate.
Figure 11B:
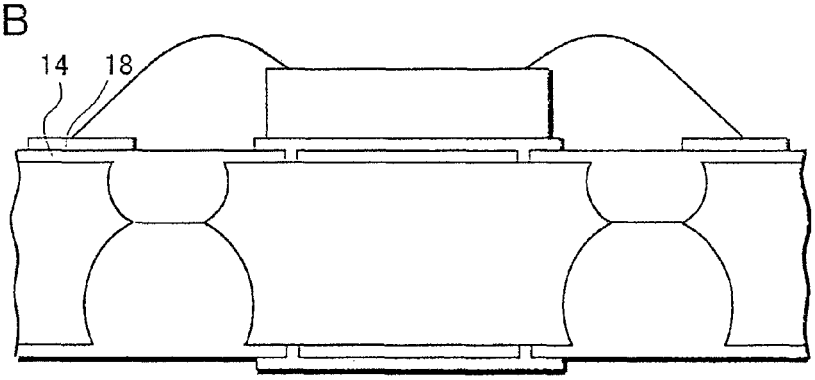
Figure 11C:
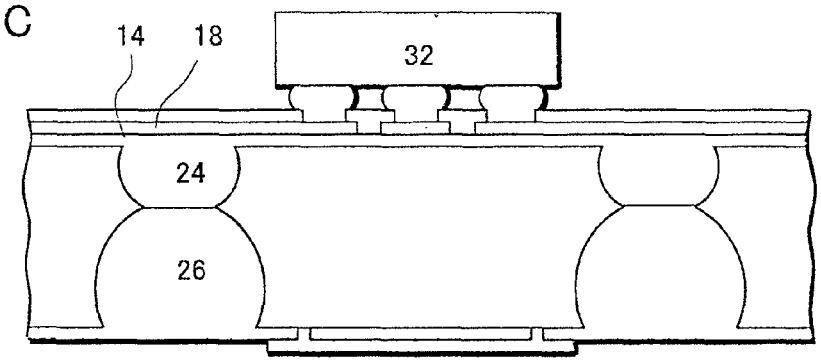

FIG. 11 shows examples of a method of transmitting heat generated by the semiconductor element to the core layer. FIG. 11(A) is an example in which a portion of the insulating layer 14 is removed, the portion corresponding to a mounting region, and the chip is mounted on an exposed portion of the core layer. Thereby, effective thermal connection is made. Next, FIG. 11(B) is an example in which multiple holes are formed at some portions of the insulating layer 14, and plating is performed on the holes in the same manner as the interlayer connection parts in FIG. 1. An island formed in this manner has thermal connection with the back surface of the chip while having large thermal resistance since the areas of the holes are small. FIG. 11(C) is an example in which the chip is mounted in a face-down manner. In this case, multiple electrodes are provided to the chip, and cannot be commonly connected to the core layer. For this reason, electrodes insulated by the insulating layer 14 are provided to correspond with the electrodes on the chip. This example of providing the chip in the face-down manner is advantageous in that the thickness in a height direction can be reduced. Moreover, although this structure has some thermal resistance, heat of the chip can be stored in the metal core layer through the insulating layer 14. In this case, the heat in the core layer can be released to the outside by forming interlayer connection parts, the second wiring layer, solder and the like on the back side of the core layer as in FIG. 1.

Further, the substrate and the circuit device configured as described above are included in a set such as an air conditioner, for example. By using the substrate and the circuit device configured as described above, in an air conditioner, the air conditioner can operate stably.

The invention claimed is:

1. A metal core substrate comprising:
a metal core layer having a first surface and a second surface opposite from the first surface;
a first insulating layer covering the first surface of the metal core layer and having a first hole;
a second insulating layer covering the second surface of the metal core layer and having a second hole;
a first wiring layer formed on the first insulating layer;
a second wiring layer formed on the second insulating layer;
a first metal connection disposed in the first hole so as to connect the first wiring layer and the first surface of the metal core layer; and
a second metal connection disposed in the second hole so as to connect the second wiring layer and the second surface of the metal core layer,
the metal core substrate being formed as a hexahedron defined by a top rectangular surface, a bottom rectangular surface and four side surfaces connecting the top and bottom rectangular surfaces, and the metal core layer including a groove separating the metal core layer into a plurality of conductive patterns that are physically separated and electrically insulated from each other; and
a semiconductor element embedded in the first insulating layer insulating the conductive patterns of the metal core layer from each other, and a third opening formed in the first insulating layer so that an electrode pad disposed on a surface of the semiconductor element and the first wiring layer on the first insulating layer are electrically connected through the opening.

2. The metal core substrate of claim 1, wherein the metal core layer is made of copper, aluminum or an alloy of copper and aluminum.

3. The metal core substrate of claim 1, wherein a sidewall of the groove includes a projection.

4. The metal core substrate of claim 1, wherein the first and second metal connections do not penetrate through the metal core layer.

* * * * *